US007342291B2

(12) United States Patent
Vogelsang

(10) Patent No.: US 7,342,291 B2
(45) Date of Patent: Mar. 11, 2008

(54) STANDBY CURRENT REDUCTION OVER A PROCESS WINDOW WITH A TRIMMABLE WELL BIAS

(75) Inventor: Thomas Vogelsang, Jericho, VT (US)

(73) Assignee: Infineon Technologies AG, Munich (DE)

( * ) Notice: Subject to any disclaimer, the term of this patent is extended or adjusted under 35 U.S.C. 154(b) by 128 days.

(21) Appl. No.: 11/402,412

(22) Filed: Apr. 12, 2006

(65) Prior Publication Data

US 2006/0189082 A1 Aug. 24, 2006

Related U.S. Application Data

(62) Division of application No. 10/873,010, filed on Jun. 22, 2004, now Pat. No. 7,060,566.

(51) Int. Cl.
*H01L 29/00* (2006.01)

(52) U.S. Cl. .............................. 257/529; 257/E23.149; 257/299; 257/901

(58) Field of Classification Search ................ 257/529, 257/E23.149

See application file for complete search history.

(56) References Cited

U.S. PATENT DOCUMENTS 4,142,114 A 2/1979 Green
5,929,695 A 7/1999 Chan et al.
5,942,781 A * 8/1999 Burr et al. .................. 257/347
6,218,895 B1 4/2001 De et al.
6,232,827 B1 5/2001 De et al.
6,549,063 B1 * 4/2003 Lehmann et al. ........... 327/525
6,605,981 B2 8/2003 Bryant et al.

OTHER PUBLICATIONS

Pierret, R., *Semiconductor Device Fundamentals*, 1996, Addison-Wesley Publishing Company, Inc., pp. 680-681.

* cited by examiner

*Primary Examiner*—Tu-Tu V. Ho
(74) *Attorney, Agent, or Firm*—Slater & Matsil, L.L.P.

(57) ABSTRACT

An integrated circuit device including a plurality of MOSFETs of similar type and geometry is formed on a substrate with an ohmic contact, and an adjustable voltage source on the die utilizing clearable fuses is coupled between the ohmic contact and the sources of the MOSFETs. After die processing, a post-processing test is performed to measure an operating characteristic of the die such as leakage current or switching speed, and an external voltage source is applied and adjusted to control the operating characteristic. The on-die fuses are then cleared to adjust the on-die voltage source to match the externally applied voltage. The operating characteristic may be determined by including a test circuit on the die to exhibit the operating characteristic such as a ring oscillator frequency. This approach to controlling manufacturing-induced device performance variations is well suited to efficient manufacture of small feature-size circuits such as DRAMs.

21 Claims, 6 Drawing Sheets

400
401
NMOS transistor
402
PMOS transistor
338
310
320
332
314
312
316
334
324
322
326
328
p+
n+
n+
n+
p+
p+
p+
n+
307
n-
306
p-
305
n-
p- substrate
304

500
place NMOS transistors in isolated p-wells
place PMOS transistors in isolated n-wells
p+
332
p-
314
306
305
n-
n+
328
324
307
p-
304
344
345
342
343
p-well bias generator
501
n-well bias generator
502
testmode / fuse control circuits
503
fuses
504

STANDBY CURRENT REDUCTION OVER A PROCESS WINDOW WITH A TRIMMABLE WELL BIAS

This application is a divisional of patent application Ser. No. 10/873,010, entitled "Standby Current Reduction Over a Process Window with a Trimmable Well Bias," filed Jun. 22, 2004, now U.S. Pat. No. 7,060,566 which application is incorporated herein by reference.

TECHNICAL FIELD

Embodiments of the present invention relate generally to semiconductor circuits, and in particular to integrated circuits such as DRAMs. Included are any integrated circuits configured with metal-oxide semiconductor field-effect transistors (MOSFETs) in which the bodies of transistors are biased with a voltage to adjust an operating characteristic such as leakage current or switching speed.

BACKGROUND

Semiconductors are generally used in integrated circuits for a wide range of electronic applications, including radios, televisions, cell phones, and personal computing devices, as examples. Over the years of development of integrated circuit, the structures used to form the integrated circuit elements such as transistors and diodes have been continually reduced in size to enable production of ever more complex devices in small sizes, with improved performance, and with low cost. An example of a highly integrated semiconductor device is a dynamic random access memory (DRAM) device in which a large number of transistors are configured to store a substantial amount of digital information in a very compact size with relatively low cost.

A result of the evolution of the present technology using MOSFET technology is the inherent wide variation of characteristics of the circuit elements comprising the integrated circuit with ordinary manufacturing variations. For example, transistors such as MOSFETs exhibit wide variations in two critical characteristics, threshold voltage and switching speed. Variations in these parameters can result in corresponding performance variations in an end product such as power dissipation, which directly affects battery life in portable applications, and switching speed, which is a critical performance metric of competitive importance. Variations in threshold voltage and switching speed in MOSFETs are caused by unavoidable variations in device parameters such as gate oxide thickness, variations in various material impurities even at very low concentrations normally achieved in the refined semiconductor materials, variations in substrate doping density, variations in dimensions of the very small structures used to form the transistors, and variations in device operating temperature. However, to precisely control device parameters in manufacturing processes, and particularly to precisely control their variations against worst-case effects with sufficient precision to produce the necessary yield in a manufacturing operation is often impractical in the leading edge designs that utilize the smallest of feature sizes. The necessary manufacturing precision often requires unusual time and effort, and is generally inconsistent with the need to produce integrated circuits in high volumes at very low cost. Present alternatives are to make compromises in end product performance by widening design margins and to accept reductions in manufacturing yield, all of which ultimately contribute to increased costs or marketing issues. A further alternative to adjust device parameters such as threshold voltage by including an additional ion implantation late in the manufacturing process is generally considered to be impractical.

However, there is opportunity to adjust the threshold voltage of a MOSFET device by means of altering the substrate or well voltage and thereby alter a device operating characteristic. MOSFETs are usually thought of as three-terminal devices that include a source and a drain as principal current carrying terminals, and a gate with a voltage referenced to the source as a control terminal. However, MOSFETs also include a substrate (or body or well) connection that is usually internally coupled via a substrate ohmic contact to the source. This connection is usually not visible, and is usually not even mentioned on data sheets for discrete devices. As recognized in the art, providing a small positive bias voltage to the body relative to the source for n-type devices can reduce the threshold voltage, or providing a small negative bias voltage to the body relative to the drain for p-type devices can increase the threshold voltage. The inverse effect with opposite sign of the voltage changes is also operable. Analytic relationships between body bias voltage and the corresponding change in threshold voltage are given, for example, in R. F. Pierret, "Semiconductor Device Fundamentals," Addison Wesley, 1996, pp. 680-681, which is incorporated herein by reference.

A number of techniques have been described in the prior art for adjusting a MOSFET threshold voltage by applying a bias voltage source to the semiconductor body. U.S. Pat. No. 4,142,114 describes applying a substrate bias voltage as function of an on-die sensed threshold voltage of a designated MOSFET, utilizing other MOSFET devices with similarly uncontrolled characteristics. U.S. Pat. No. 5,929,695 describes applying a predetermined substrate bias voltage to a well containing a first group of MOSFETs exhibiting a larger threshold voltage than another group, thereby reducing the threshold voltage of the first group. U.S. Pat. No. 6,218,895 describes providing a predetermined forward bias voltage to a group of MOSFETs so as to reduce their threshold voltage, thereby increasing their drive current for a given gate voltage, and disabling the forward bias voltage during standby periods so as to reduce leakage currents. The improvement disclosed in the U.S. Pat. No. 6,218,895 patent requires that the necessary forward bias voltage be predicted before manufacture. U.S. Pat. No. 6,232,827 describes increasing the net channel doping level in MOSFETs by at least 25%, which reduces the device threshold voltage, and then applying a compensating but predetermined forward body bias voltage to adjust the threshold voltage roughly back to the value that would have been obtained without the increased doping level. U.S. Pat. No. 6,605,981 describes a global body bias circuit utilizing a series arrangement of n- and p-type MOSFETs to match the leakage currents of other n- and p-type devices on the die, thereby attempting to balance the effects of manufacturing process variations on leakage currents and device switching characteristics.

A limitation of these prior art designs is their general inability after wafer and die processing to accurately compensate a die containing a plurality of MOSFET devices of a similar conductivity type and geometry by selecting and setting a body bias voltage for the general variation of characteristics resulting from observed manufacturing variations. By similar conductivity type and geometry we mean substantially the same doping type and profile and, for example without limitation, substantially a same dimension for a device structure. Parameter variations across a single die or even across a wafer containing thousand of dice are usually sufficiently small so that characterization of a device such as a transistor of a particular conductivity type and geometry allows reasonably accurate prediction of the characteristics of similar devices elsewhere on the same die or even the same wafer. Thus, measurements of a critical characteristic can generally be made of a manufactured device and a substrate bias voltage can be accurately determined and set for all devices of a similar conductivity type and geometry that balances a range of observed parameter variations. The effect can be reliably expected to properly compensate all devices of a similar conductivity type and with similar geometry on the same die or on the same wafer. The process can be repeated for other device conductivity types and geometries.

SUMMARY OF THE INVENTION

In one aspect, the present invention relates to an integrated circuit device formed with MOSFETs, including an adjustable voltage source on the integrated circuit device. The adjustable voltage source is configured to control an operating characteristic of the device by providing a voltage difference between a body or substrate contact of the integrate circuit and source terminals of the MOSFETs. Critical operating characteristics such as leakage current or switching speed that affect device performance, particularly for integrated circuits processed with fine line structures that may include short gate structures, depend substantially on processing variables. In response to the difficulty or impracticality to control such variables during manufacture to suitable levels of accuracy, particularly from lot to lot, the on-die voltage source is adjusted. The operating characteristic of interest is measured after die processing in a post-processing test, and an external voltage source is applied and adjusted to determine the voltage required to control the operating characteristic. Then the adjustable voltage source on the die is adjusted by clearing on-die fuses, for example, to match the voltage of the external voltage source. Alternatively, resistive paths may be trimmed on the die using techniques such as laser vaporization to provide the required adjusted voltage. Thereby the design and efficient manufacture of high density and low cost integrated circuit devices is enabled.

In a further aspect of the present invention, MOSFETs of a similar conductivity type and geometry are formed in a common well that is produced using diode or dielectric isolation techniques. A contact to the well is formed by creating a small, heavily doped structure in the well. In a further aspect a plurality of wells are formed so that MOSFETs of a similar conductivity type and geometry may be separately controlled by separate voltage sources.

In a further aspect of the present invention, the on-die voltage source is configured using a charge-pump circuit with an output voltage that is controlled by an adjustable voltage reference. The adjustable voltage reference may employ a resistor-divider network that may be set by fuse-clearing techniques or by laser-trimming a resistive path. The adjustable voltage reference may be set after determining the required output voltage using a post-die-processing arrangement employing an adjustable voltage source externally applied to the die. In another aspect of the present invention, other voltage conversion techniques may be employed as are well understood in the art, including configuring the voltage converter off the chip and applying a reference voltage source to the chip which is adjusted after die processing to provide the adjusted voltage.

In a further aspect of the present invention, the operating characteristic is observed by including a test circuit on the die such as a ring oscillator or one or more test transistors and measuring an operating characteristic such as oscillator frequency or leakage current. Preferably, the operating characteristic is adjusted after die processing.

In a further aspect of the present invention, a characteristic of a die is measured after die processing and voltages on a plurality of dice on a wafer are adjusted from that measurement to improve an operating characteristic of the plurality of dice.

Another embodiment of the present invention is a method of configuring an integrated circuit device formed with MOSFETs, and including an adjustable voltage source on the integrated circuit device. The method includes configuring the adjustable voltage source to control an operating characteristic of the device by providing a voltage difference between a body or substrate contact of the integrate circuit and source terminals of the MOSFETs. Critical operating characteristics such as leakage current or switching speed that affect device performance, particularly for integrated circuits processed with fine line structures and including short gate structures, depend substantially on processing variables. In response to the difficulty or impracticality to control such variables during manufacture to suitable levels of accuracy, particularly from lot to lot, the method includes adjusting the on-die voltage source. The method further includes measuring an operating characteristic of interest after processing the die in a post-processing test, and applying an external voltage source and adjusting it to determine the voltage required to control the operating characteristic. The method further includes adjusting the voltage source on the die by clearing on-die fuses, for example, to match the voltage of the external voltage source. Alternatively, method includes trimming resistive paths on the die using techniques such as laser trimming to provide the required adjusted voltage. Thereby the method enables the design and efficient manufacture of high density and low cost integrated circuit devices.

In a further aspect of the present invention the method further includes forming MOSFETs of a similar conductivity type and geometry in a common well that is produced using diode or dielectric isolation techniques. The method includes forming a contact to the well by creating a small, heavily doped structure in the well. In a further aspect method includes forming a plurality of wells so that MOSFETs of a similar conductivity type and geometry may be separately controlled by separate voltage sources.

Embodiments of the present invention achieve technical advantages by a method of configuring the on-die voltage source using a charge-pump circuit with an output voltage that is controlled by an adjustable voltage reference. In a further aspect the method includes employing a resistor-divider network in the adjustable voltage reference that may be set by fuse-clearing techniques or by laser-trimming a resistive path. In a further aspect the method includes setting the adjustable voltage reference after determining the required output voltage using a post-die-processing arrangement employing an adjustable voltage source externally applied to the die. In another aspect of the present invention, the method includes employing other voltage conversion techniques as are well understood in the art, including configuring the voltage converter off the chip and applying a reference voltage source to the chip which is processed to provide the adjusted voltage.

In a further aspect of the present invention the method includes observing an operating characteristic by including a test circuit on the die such as a ring oscillator or one or more test transistors and measuring an operating characteristic such as oscillator frequency or leakage current. In a further aspect of the present invention, the method includes measuring the operating characteristic after die processing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an integrated circuit including MOSFET devices configured with a trimmable well bias that is adjustable in a testmode process after die processing to improve an operating characteristic of a device, for example, to reduce standby current or to improve switching characteristics. The invention may be applied to logic or DRAM memory devices and other MOS integrated circuits to improve an operating characteristic over a design or manufacturing process window.

Figure 1:
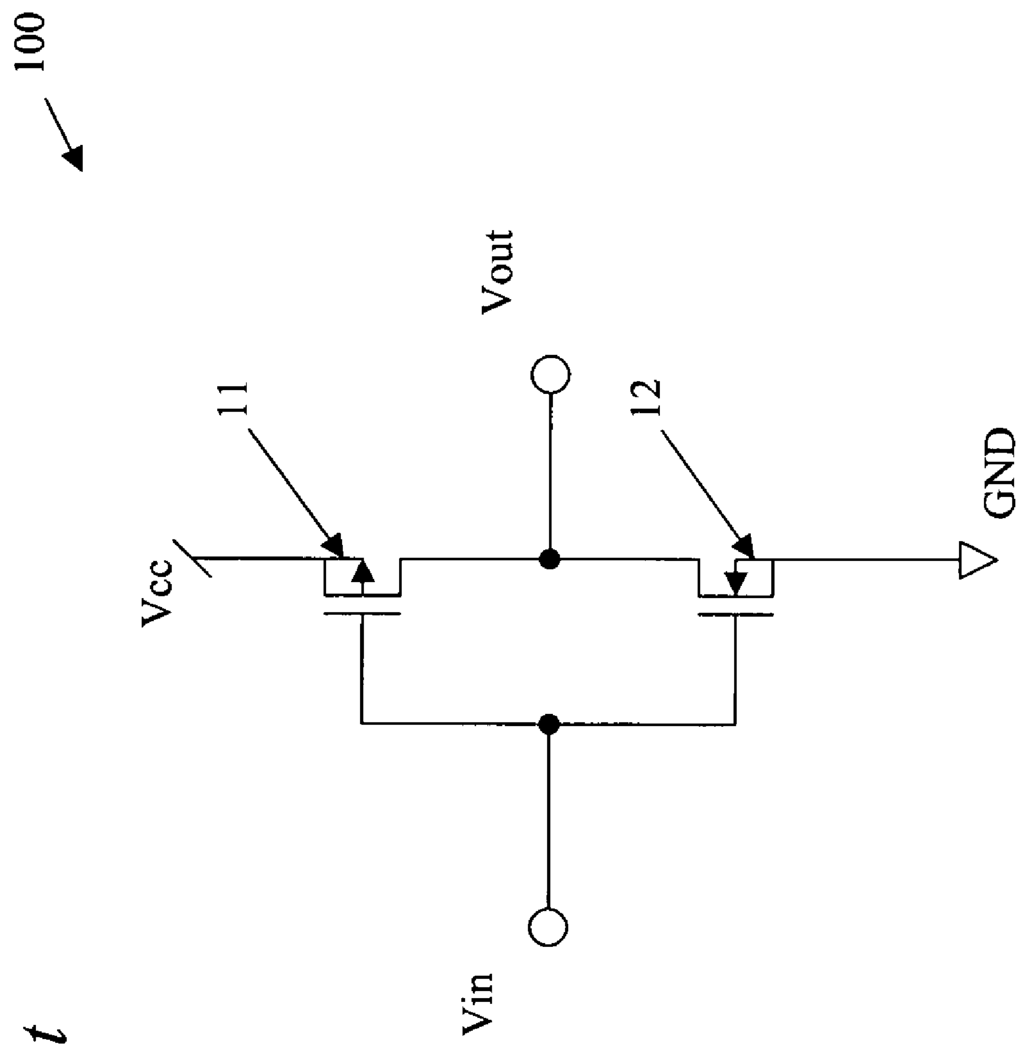
FIG. 1 shows a circuit for an inverter including PMOS and NMOS transistors in a series arrangement according to the prior art.

Referring now to FIG. 1, illustrated is an exemplary inverter 100 including a PMOS transistor 11 coupled in series with an NMOS transistor 12 that might be configured as an integrated circuit subject to manufacturing process variations. Such an inverter can be used to simply invert a logic signal applied to the input Vin, or to provide power amplification for the signal so that that a load with substantial capacitive or conductive characteristics can be driven by the output, Vout. The source of the PMOS transistor 11 is coupled to a positive voltage source Vcc, and the source of the NMOS transistor 12 is coupled to ground. The gates of both transistors are coupled together and to an input signal at node Vin. The drains of both transistors are coupled together and to an output node Vout.

In operation, when the voltage at the input node Vin is raised close to the bias voltage Vcc, the NMOS transistor 12 is turned on and the PMOS transistor 11 is turned off. This results in the voltage of the output node Vout being pulled substantially to ground potential. When the voltage at the input node Vin is reduced close to ground voltage, the NMOS transistor 12 is turned off and the PMOS transistor 11 is turned on. This results in the voltage of the output node Vout being pulled substantially to the potential of the bias voltage Vcc. Thus, the circuit operates to invert the signal applied at the input node Vin to produce an inverted and amplified signal at the output node Vout.

Each transistor illustrated on FIG. 1 has an ohmic connection between its body (or substrate or well) and its source as illustrated on the figure with arrows coupled to the source terminals of the respective devices. This circuit arrangement, in which the body of an NMOS or PMOS transistor is coupled to its source, is a common prior-art circuit arrangement wherein each transistor, 11 and 12, generally exhibits a substantial spread of operating characteristics due to manufacturing variations in its threshold voltage, i.e., the voltage of its gate terminal with respect to the voltage of its source terminal at which the transistor substantially turns on. For devices configured to operate with bias voltages less than 3.3 volts, for example, the nominal threshold voltage might be 300 mV, and the threshold voltage variation from 200 to 400 mV. With the circuit arrangement illustrated on FIG. 1, if either of the transistors 11 or 12 is produced with a low threshold voltage, then the circuit may exhibit substantial leakage current between the bias voltage Vcc and ground, GND, even when the circuit is not switching. Alternatively, if the threshold voltage is high, the circuit may exhibit slow switching speed.

Figure 2:
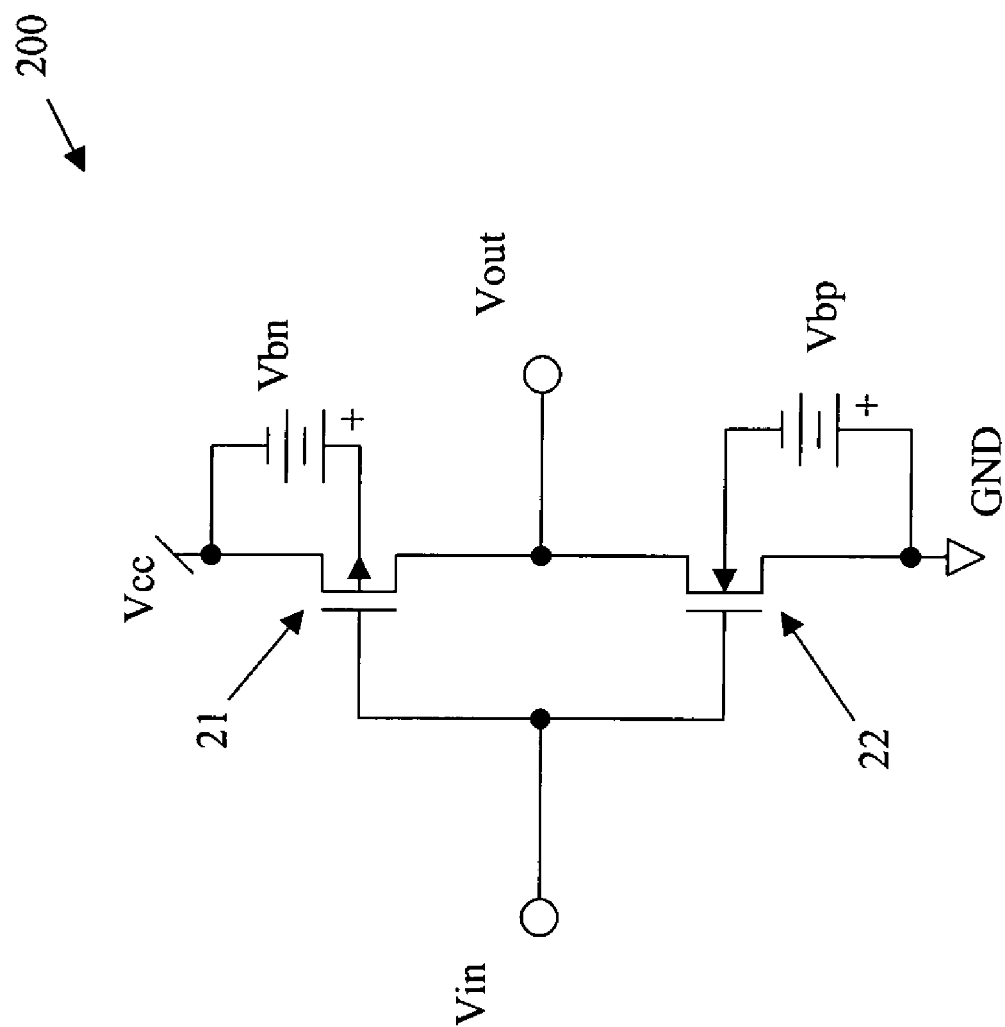
FIG. 2 shows a circuit for an inverter including PMOS and NMOS transistors in a series arrangement with bodies coupled to voltage sources to adjust threshold voltages.

Referring now to FIG. 2, illustrated is an inverter 200 including a PMOS transistor 21 coupled in series with an NMOS transistor 22, an input node Vin, and an output node Vout. The circuit is powered by a bias voltage source coupled between Vcc and GND. The general circuit arrangement illustrated in FIG. 2 is similar to that in FIG. 1, except that the body connections to the switching transistors 21 and 22 are shown as independent terminals and are coupled to the voltage sources Vbn and Vbp, respectively. Although the voltage sources Vbn and Vbp are illustrated as batteries, in practice, of course, these might be configured as adjustable charge pumps or other voltage conversion arrangements as is well understood in the art.

Figure 3:
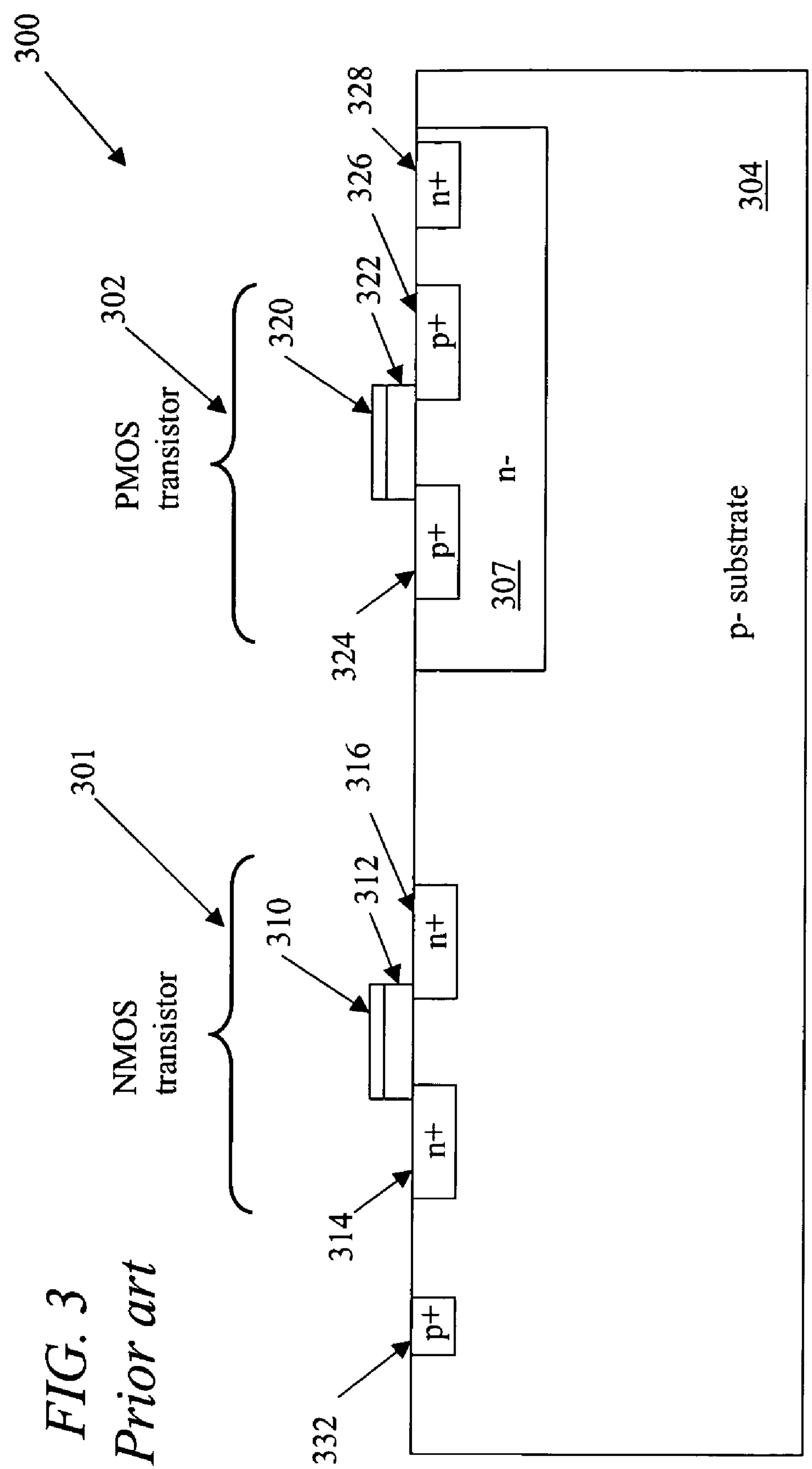
FIG. 3 illustrates PMOS and NMOS transistors implemented on a p-type substrate according to the prior art.

By coupling the body terminals of the transistors 21 and 22 to adjustable voltage sources referenced to their respective source terminals, adjustment can be made to their threshold voltages. For example, if the voltage coupled to the body terminal of the NMOS transistor 22 is increased, i.e., if it is made more positive than its source terminal, then the threshold voltage of this transistor will be decreased. A corresponding adjustment to the threshold voltage of the PMOS transistor 21 can similarly be made by changing the voltage coupled to its body terminal. In this manner the leakage current of the circuit can be altered or the switching characteristics of the transistors can be changed to accommodate variations in a manufacturing process that would otherwise be difficult or expensive to achieve. FIG. 3 of U.S. Pat. No. 6,218,895, which is incorporated herein by reference, including the description in the associated portion of the specification thereof, provides an exemplary graph illustrating dependence of a MOSFET drain current on a forward or reverse bias of body voltage Referring now to FIG. 3, illustrated to represent the prior art is a cross-sectional view of an integrated circuit device 300 including an NMOS transistor 301 and a PMOS transistor 302 formed on a (lightly doped) p-type substrate 304 to configure an integrated circuit, shown in a cross sectional view in the figure. The NMOS transistor 301 includes a source 314 and a drain 316, formed by heavily doping the respective regions with an n-type dopant as is well understood in the art. Similarly, the PMOS transistor 302 includes a source 324 and a drain 326, formed by heavily doping the respective regions with a p-type dopant. Each transistor has a gate structure, 310 and 320 respectively, formed above a thin dielectric layer, 312 and 322 respectively, such as silicon dioxide. The PMOS transistor 302 is formed in a (lightly doped) n-type well 307 that is diode isolated from the p-type substrate 304. An ohmic connection 332 to the p-type substrate 304 is shown as a P+ region, heavily doped to exhibit ohmic properties. Of course, numerous NMOS and PMOS transistors can be formed in the indicated areas to produce an integrated circuit of greater complexity as is common practice in the art. Generally, numerous PMOS transistors can be formed in a single or in multiple n-type wells. As is also ordinary practice in the art, the body terminals 328 and 332 are generally coupled to circuit ground or to a voltage reference common to respective source terminals of the device, resulting in the previously discussed spread in threshold voltages for the MOSFETs due to manufacturing variations and their potentially compromised performance or manufacturing yields.

Figure 4:
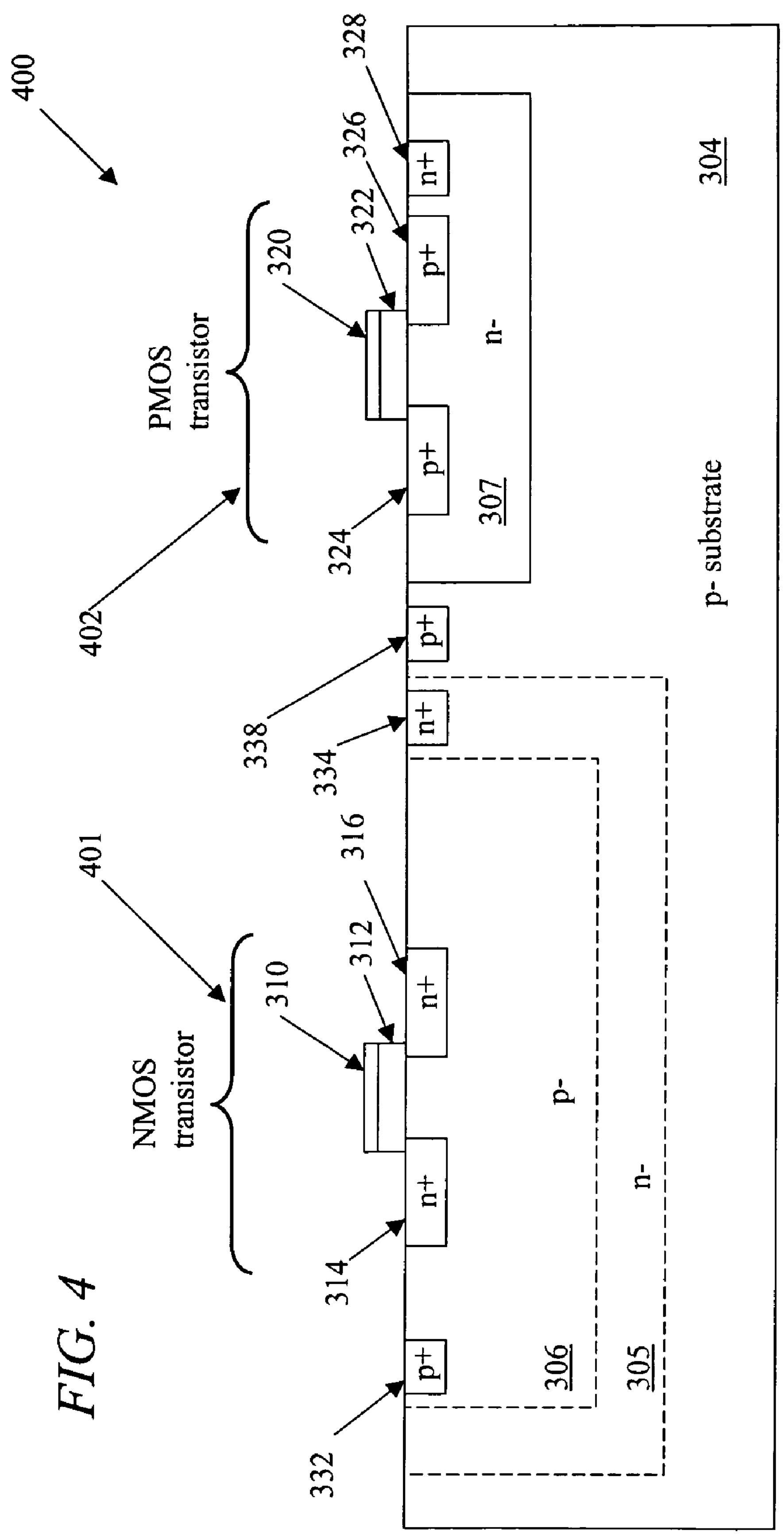
FIG. 4 illustrates PMOS and NMOS transistors implemented on a p-type substrate with diode-isolated wells.

Turning now to FIG. 4, illustrated is a cross-sectional view of an integrated circuit device 400, representing a configuration of the present invention, including an NMOS transistor 401 and a PMOS transistor 402 formed on a p-type substrate 304, with source terminals 314 and 324, respectively, gate terminals 310 and 320, respectively, and drain terminals 316 and 326, respectively, formed in a manner similar to the arrangement illustrated in FIG. 3. Gates 310 and 320 are isolated from their respective substrates or wells by gate oxide layers 312 and 322. The PMOS transistor 402 is formed in an n-type well 307 and thereby is diode isolated from the p-type substrate 304. The NMOS transistor 401 is shown in the figure in a triple well to provide isolation for this transistor. This triple well is produced by forming a lightly doped n-type well 305 in the p-type substrate 304, and subsequently forming a lightly doped p-type well 306 is in the n-type well 305. Nodes 328, 332, 334, and 338 provide ohmic contacts to the respective wells and to the substrate 304, as indicated on the figure, providing thereby nodes to couple an adjustable well bias voltage source to allow adjustment of gate threshold voltages after testmode measurements. Transistors of a similar conductivity type and geometry could be placed in a common well with a single node to collectively adjust their threshold voltages, relying on the similarity of properties of transistors formed on the same die or wafer. Alternatively, they can be placed in different wells. Wells formed with dielectric isolation are an alternative to diode isolation within the scope of the present invention. Dielectric isolation barriers or single or multiple barriers with a different doping type may also be placed between wells of similar or different conductivity type to provide additional isolation means between wells, thereby to reduce or prevent currents that may flow between wells that are biased with different potentials.

Figure 5:
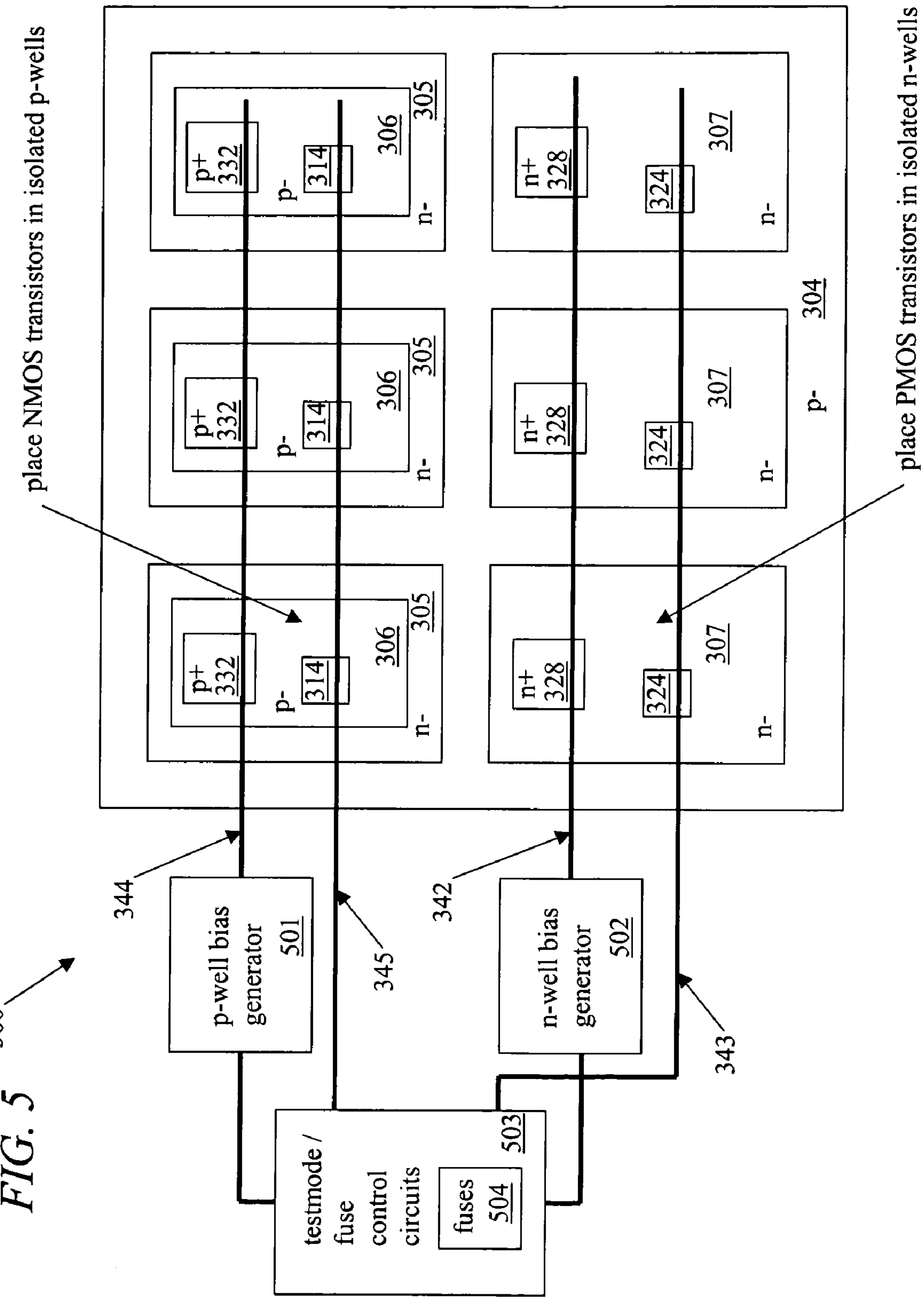
FIG. 5 illustrates a body biasing arrangement according to the present invention for PMOS and NMOS transistors.

Turning now to FIG. 5, illustrated is a plan view of an integrated circuit 500 coupled to adjustable voltage sources 501 and 502, arranged to provide adjustable bias voltages for the p-type wells 306 and n-type wells 307. The voltage sources providing the bias voltages may be configured with charge pumps or other voltage conversion arrangements as previously indicated hereinabove. The n-type wells 307 are configured with ordinary diode isolation from the substrate 304. The p-type wells 306 are triple wells in that they are formed in the n-type wells 305 which in turn are formed on the p-type substrate 304. Thus, the p-type wells 306 exhibit double diode isolation from the p-type substrate 304. Ohmic contacts 328 are formed by heavily doping these n-type regions, and ohmic contacts 332 are formed by heavily doping these p-type regions to provide ohmic contacts to their respective isolated n- and p-type wells. The p-type wells are shown coupled to the p-well bias generator 501 via conductor 344, which provides an adjustable bias voltage between the p-type wells 306 and the source terminals of MOSFETs formed in the wells via conductor 345 as indicated in the figure by the representative n-type MOSFET source terminals 314. Similarly, the n-type wells are coupled to the n-well bias generator 502 via conductor 342 to provide an adjustable bias voltage between the n-type wells 307 and the source terminals of MOSFETs formed in these wells via conductor 343 as indicated in the figure by the representative p-type MOSFET source terminals 324. Reference is made back to FIG. 4, which illustrates representative drain and gate terminals for the MOSFETs represented in FIG. 5 only by source terminals. Both bias generators 501 and 502 are controlled by the testmode/fuse control circuits 503, which in turn are adjusted by selectively clearing fuses 504.

The testmode/fuse control circuits 503 are typically configured with fuses 504 coupled to resistor-divider networks so that the voltages of the adjustable voltage sources 501 and 502 can be selectively controlled after a die or wafer has been processed. Testmode measurements are processes that typically sense the results of manufacturing variations, and can be configured to apply a variable external bias voltage to the die or wafer under test. In a typical manufacturing flow the standby current, for example, of a die will be measured, and then a post-processing arrangement will be used to trim the high standby current semiconductor devices with a negative well bias for the n-channel transistors, and a positive bias for the p-channel transistors. Alternatively, the same approach using the opposite change in well bias voltage can be used to reduce the effective threshold voltage to increase the performance of parts, for example, parts with low switching performance. These techniques are particularly useful for improving yield and performance with short gate length parts at the low implant corner of the process window. The body bias voltages may be determined by applying an adjustable external voltage source and therewith determining the optimal well bias voltage by directly observing die performance, preferably after die processing. The adjustable voltage sources 501 and 502 can be permanently set by selectively blowing fuses coupled to the resistor-divider network to produce the well bias voltage that was determined. After the adjustable voltage sources have been set, further testing can be performed to verify quality and specification compliance for these post-processed integrated circuits.

Fuse clearing to set circuit parameters of an integrated circuit is well known in the art and can be accomplished by selectively passing high currents through the fuses to be cleared, or, preferably, by using a focused laser beam on the selected fuses to vaporize portions of the conductive paths. An exemplary resistor-divider network 600 that can be used to provide an adjustable reference voltage for a controlled voltage converter to produce an adjustable well voltage utilizing fuse clearing is illustrated FIG. 6. The circuit includes a series arrangement of resistors R1, R2, and R3 and resistor R10. Resistor R1 is coupled to a reference voltage Vref and resistor R10 is coupled to local circuit ground, GND. Fuses F1 F2, and F3 are represented in the figure by switches that can be selectively opened by a fuse-clearing process. The adjustable output voltage, Vadj, is thus set by the fuse-clearing process. Although only three fuses and three resistors are shown in the upper portion of the circuit, a large number of each would typically be used to provide a fine level of voltage adjustment. In addition, the value of the individual resistors might be selected in a powers-of-two arrangement such as 1 ohm, 2 ohms, 4 ohms, etc., to provide the required granularity of voltage adjustment using a minimal number of resistors and fuses, using techniques well known in the art.

Figure 6:
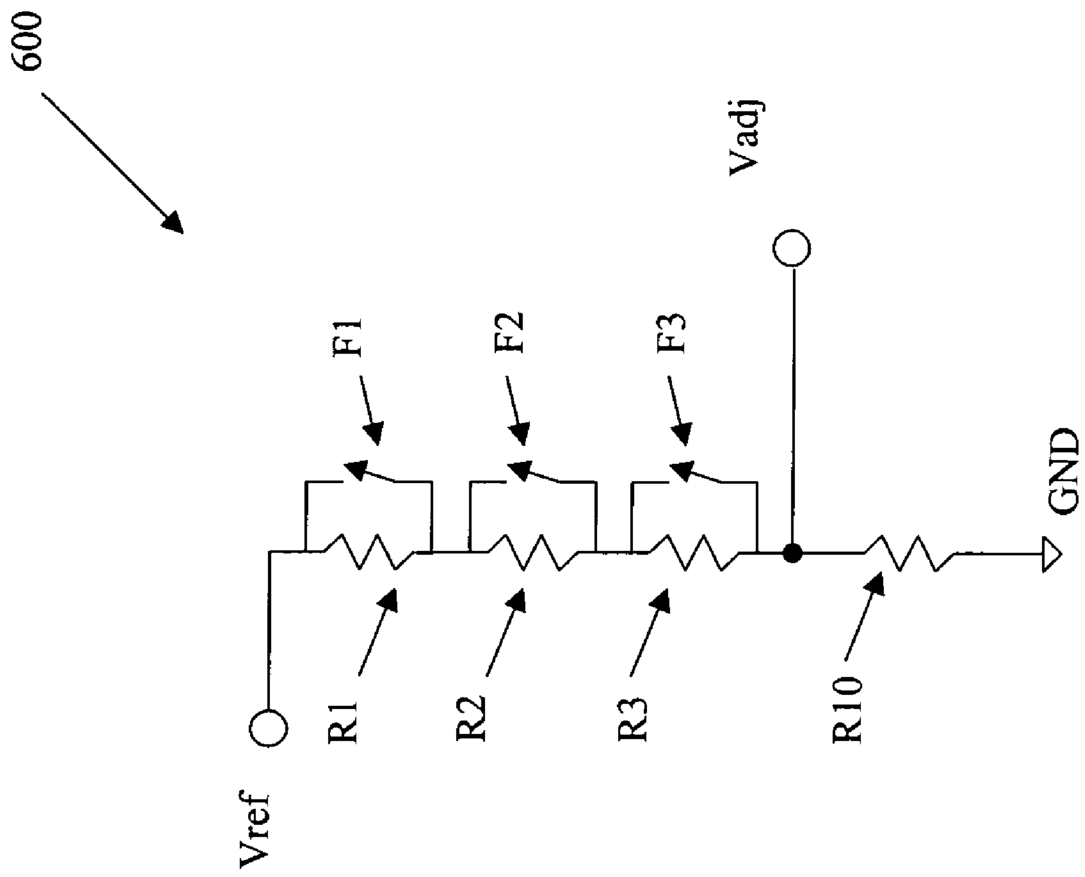
FIG. 6 illustrates a trimmable resistor divider with paralleling fuses configured to provide an adjustable output voltage.

The adjustable voltage provided by the circuit illustrated in FIG. 6 may be used as a variable reference voltage for a charge-pump voltage converter. Voltage converters employed as a voltage source with an output voltage dependent on a reference voltage are well known in the art. An exemplary charge-pump voltage converter circuit is illustrated in FIG. 2 in U.S. Pat. No. 4,142,114, which is hereby incorporated herein by reference in its entirety, in which an output voltage VBB is produced dependent on a reference voltage VR. The adjustable resistor divider network described hereinabove with reference to FIG. 6 can be substituted for the resistor-divide network R1, R2 in FIG. 2 in U.S. Pat. No. 4,142,114 to produce an adjustable voltage source.

Post-processing measurements of an integrated circuit need not be limited only to a standby current. Any die property that can be measured, either by including a special test circuit on the die or wafer or by measuring properties of the functioning integrated circuit itself, can be used. For example, a ring oscillator can be configured on the die or wafer and its frequency measured and adjusted to a desired value by altering a body bias voltage, thereby controlling a switching delay. Alternatively, the threshold voltage of a test transistor can be measured and adjusted to a desired value to provide a desired leakage current. These test and adjustment processes may be repeated for transistors of different conductivity types and geometries in different wells. Electrical access to the circuits on the die or wafer is generally required for the test and measurement process and may be accomplished by means of pads that are included in the circuit layout. Such pads may be electrically powered or sensed with finely tipped probes in automated fixtures as is customary in the art.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques and materials to form the integrated circuits including the isolating wells described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device, comprising:

a semiconductor substrate including an ohmic contact and a plurality of metal-oxide semiconductor field effect transistors (MOSFETs) formed in the substrate, each MOSFET including a source terminal, a drain terminal, and a gate terminal and having an operating characteristic;

a plurality of fuses located on said semiconductor substrate; and a first voltage source with an output voltage coupled between the ohmic contact and the source terminal of each of the MOSFETs, said output voltage being adjustable by clearing selected ones of said plurality of fuses in response to an external measurement of the operating characteristic.

2. The integrated circuit as in claim 1 wherein the external measurement of the operating characteristic is performed after die processing.

3. The integrated circuit device as in claim 2 further comprising a second, externally adjustable voltage source between the ohmic contact and the source terminals of the MOSFETs for determining the selective fuses that are to be cleared.

4. The integrated circuit device as in claim 2 further comprising a laser source to vaporize said fuses to be cleared.

5. The integrated circuit device as in claim 1 wherein the first voltage source is located on the semiconductor substrate.

6. The integrated circuit device as in claim 1 wherein the MOSFETs are formed in an isolated well.

7. The integrated circuit as in claim 1 wherein each of the MOSFETs in the plurality of MOSFETS is of similar conductivity type and geometry.

8. The integrated circuit device as in claim 1 wherein the operating characteristic comprises drain-to-source leakage current.

9. The integrated circuit device as in claim 1 wherein the substrate comprises a p-type substrate.

10. The integrated circuit device as in claim 1 wherein the integrated circuit device comprises a DRAM.

11. The integrated circuit device as in claim 1 further comprising a test circuit located on the integrated circuit device for measuring the operating characteristic after die processing.

12. An integrated circuit device, comprising:

a semiconductor substrate including an ohmic contact and a plurality of metal-oxide semiconductor field effect transistors (MOSFETs) formed in the substrate, each MOSFET including a source terminal, a drain terminal, and a gate terminal and having an operating characteristic;

a resistive path located on said integrated circuit device; and a first voltage source with an output voltage coupled between the ohmic contact and the source terminal of each of the MOSFETs, said output being adjusted by selectively vaporizing material from said resistive path according to an external measurement of the operating characteristic.

13. The integrated circuit as in claim 12 wherein the external measurement of the operating characteristic is performed after die processing.

14. The integrated circuit device as in claim 13 further comprising a second, externally adjustable voltage source between the ohmic contact and the source terminals of the MOSFETs for determining the selective vaporization of material from said resistive path.

15. The integrated circuit device as in claim 13 further comprising a laser source to vaporize said material form said resistive path.

16. The integrated circuit device as in claim 13 wherein the first voltage source is located on the semiconductor substrate.

17. The integrated circuit device as in claim 13 wherein the MOSFETs are formed in an isolated well.

18. The integrated circuit as in claim 13 wherein each of the MOSFETs in the plurality of MOSFETS is of similar conductivity type and geometry.

19. The integrated circuit device as in claim 13 wherein the operating characteristic comprises drain-to-source leakage current.

20. The integrated circuit device as in claim 13 wherein the integrated circuit device comprises a DRAM.

21. The integrated circuit device as in claim 13 further comprising a test circuit located on the integrated circuit device for measuring the operating characteristic after die processing.

* * * * *

UNITED STATES PATENT AND TRADEMARK OFFICE

CERTIFICATE OF CORRECTION

PATENT NO. : 7,342,291 B2
APPLICATION NO. : 11/402412
DATED : March 11, 2008
INVENTOR(S) : Vogelsang It is certified that error appears in the above-identified patent and that said Letters Patent is hereby corrected as shown below:

In Col. 11, line 7, delete “form” and insert --from--.

Signed and Sealed this

First Day of July, 2008

JON W. DUDAS
*Director of the United States Patent and Trademark Office*